US008780004B1

(12) United States Patent
Chin

(10) Patent No.: US 8,780,004 B1
(45) Date of Patent: Jul. 15, 2014

(54) DUAL CONFIGURATION ENCLOSURE WITH OPTIONAL SHIELDING

(75) Inventor: Kam Cheong Chin, Irvine, CA (US)

(73) Assignee: Western Digital Technologies, Inc., Irvine, CA (US)

(*) Notice: Subject to any disclaimer, the term of this patent is extended or adjusted under 35 U.S.C. 154(b) by 351 days.

(21) Appl. No.: 13/363,025

(22) Filed: Jan. 31, 2012

(51) Int. Cl.
*H01Q 1/52* (2006.01)
*H05K 9/00* (2006.01)

(52) U.S. Cl.
USPC ........... 343/841; 343/872; 361/816; 361/818; 455/301

(58) Field of Classification Search
CPC ................ H05K 2201/10371; G06F 1/182; H01Q 1/526
See application file for complete search history.

(56) References Cited

U.S. PATENT DOCUMENTS

| 6,058,024 | A * | 5/2000 | Lyford | 361/816 |
| 6,600,663 | B1 * | 7/2003 | Koleda | 361/816 |
| 6,977,822 | B2 * | 12/2005 | Otani et al. | 361/800 |
| 7,277,301 | B2 | 10/2007 | Liang | |
| 2002/0057560 | A1 | 5/2002 | Okada | |
| 2003/0107881 | A1 | 6/2003 | Muramatsu et al. | |
| 2003/0128534 | A1 | 7/2003 | Otani et al. | |
| 2006/0012969 | A1 * | 1/2006 | Bachman | 361/816 |
| 2006/0246866 | A1 | 11/2006 | Nakagawa et al. | |
| 2006/0289191 | A1 | 12/2006 | Yamashita | |
| 2008/0073739 | A1 | 3/2008 | Kitamura et al. | |
| 2009/0146901 | A1 | 6/2009 | Shibata et al. | |
| 2010/0090923 | A1 * | 4/2010 | Sato et al. | 343/872 |
| 2011/0080721 | A1 * | 4/2011 | Yukiyoshi | 361/816 |
| 2011/0128715 | A1 | 6/2011 | Noguchi et al. | |
| 2011/0205710 | A1 | 8/2011 | Kondo et al. | |

* cited by examiner

*Primary Examiner* — Trinh Dinh

(57) ABSTRACT

An enclosure for an electronic device may include an outer enclosure and an optional metallic cage. The metallic cage may include sides, a bottom and a top that collectively define an enclosed volume, with the top being slanted at a non-zero angle with respect to the bottom. The outer enclosure may at least partially enclose the metallic cage and may define a plurality of structural posts and a top surface that faces the top of the metallic cage. The top surface may define a plurality of recesses, each being configured to receive a wireless antenna of the electronic device. The recesses may be oriented to provide a predetermined angular displacement between the antennas and may be disposed to define a predetermined spacing relative to the metallic cage. A set of beveled through-holes may be defined in the top of the metallic cage, aligned with respective ones of the structural posts.

18 Claims, 5 Drawing Sheets

DUAL CONFIGURATION ENCLOSURE WITH OPTIONAL SHIELDING

BACKGROUND

Many electronic devices include internal shielding or Faraday cages to reduce EMI emissions and interference. However, these cages require modification of the device enclosure and add expense to the resultant device. In addition, such cages can cause difficulties in assembly of the electronic device because certain components, such as wiring or antenna, may need to pass through the cage. Such assembly difficulties translate directly into increased unit costs and decreased yield. Also, the internal shielding or Faraday cages may interfere with the proper functioning of the antenna by, for example, decreasing the signal strength emitted or received by the antenna. Moreover, conventional enclosures do include any provisions for supporting and orienting the antennas in an optimal orientation or distance relative to the Faraday cage. What are needed, therefore, are improved electromagnetic shields and is enclosures for electronic devices that do not suffer from the above-described disadvantages.

DETAILED DESCRIPTION

Figure 1:
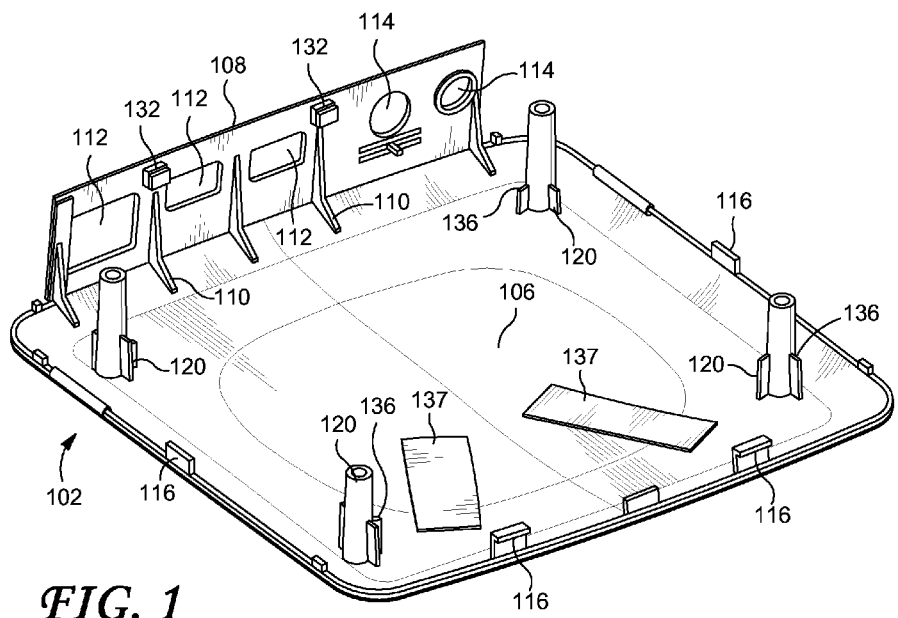
FIG. 1 shows one embodiment of a top cover of an enclosure for electronic device.
Figure 2:
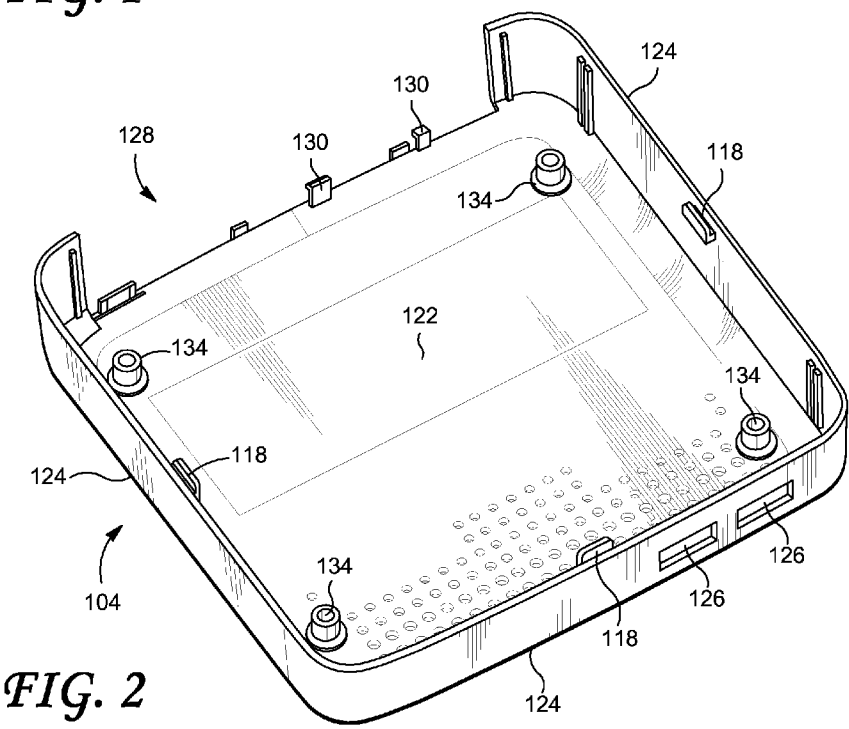
FIG. 2 shows one embodiment of a bottom cover of an enclosure for an electronic device.

FIG. 1 shows one embodiment of a top cover 102 and FIG. 2 shows one embodiment of a bottom cover 104 of an outer enclosure for electronic device. The top cover 102 and/or the bottom cover 104 may include, for example, a plastic material and may be formed using an injection molding process. The top cover 102 may include a top 106 and a back side surface 108 supported and reinforced by buttresses 110. The back surface 108 may define one or more cutouts 112 disposed and sized to accommodate one or more electrical connectors (not shown in FIG. 1) therethrough for power and/or data. Other cutouts, shown at 114, may be configured to receive buttons, knobs, displays or other user-actuated or passive interface of the electronic device to be enclosed. As shown in FIG. 1, the top cover 102 may also include one or more detent tabs 116 that are configured to insert into and lock with corresponding detent slots 118, formed in the bottom cover 104 of FIG. 2. The top cover 102 and/or the bottom cover 104 may include a plurality of structural posts. The top cover may include a plurality of integral structural posts 120. The structural posts 120, for example, may be disposed at or near the corners of the top cover 102 and may be formed as threaded cylinders extending away from the base of the top cover 102. The structural posts 120 may be reinforced by ribs extending radially away from the threaded cylinder and secured to the base of the top cover 102. For example, the ribs may collectively define, for example, an "X" or cross-shaped footprint, and may define a ledge 136 between the free end of the threaded cylinder and the base thereof, with the ribs defining a wider profile from the ledge 136 to the base of the top cover 102.

As shown in FIG. 2, the bottom cover 104 of the outer enclosure formed by the top and bottom covers 102, 104 is configured to mate with and attach to, the top cover 102. The bottom cover 104, as shown, may include a bottom surface 122 from which sides 124 rise and extend. One or more of the sides 124 may define one or more cutouts 126 configured to receive buttons, knobs, displays, indicators or other user-actuated or passive interface of the electronic device to be enclosed. A cutout 128 may be defined at the back end bottom cover 104, shaped and dimensioned to accommodate the back surface 108 of the top cover 102. The bottom cover 104 may also include one or more detent tabs 130 configured to fit into and lock with corresponding detent slots 132 formed in the top cover 102, to secure the top cover 102 to the bottom cover 104. As shown, the bottom cover 104 may define a plurality of (e.g., cylindrical) projections 134 each forming a blind bore through the bottom cover 104, at or near the corners thereof. Each of the projections 134 are configured to be aligned with a corresponding one of the integral structural posts 120 of the top cover 102. The top and/or the bottom cover 102, 104 may define a plurality of openings or slots therethrough for, e.g., heat dissipation and/or acoustical purposes.

When the top 102 and bottom cover 104 are faced and pressed together, the detent tabs 116, 130 may engage and snap fit (or, for example, interference fit) with corresponding ones of the detent slots 118, 132 to secure the top and bottom covers 102, 104 to one another to form the outer enclosure of an enclosed electronic device. Also, the structural posts 120 line up with, and optionally contact, corresponding ones of the projections 134. Screws (best shown in cut-away at 602 in FIG. 6) may be inserted into the blind bores of the projections 134 of the bottom cover 104 and into the treaded cylinders of the structural posts 120 of the top cover 102 and screwed tight, to thereby securely fasten the top and bottom covers 102, 104 of the outer enclosure to one another. The thus-formed and assembled outer enclosure may enclose an electronic device that includes one or more printed circuit boards (PCBs), connectors, indicators and/or displays. When the electronic device includes one or more antenna(s), provisions may be made within the outer enclosure for securing and placing the antenna(s) within or on either to top or the bottom cover 102, 104. In the embodiment shown in FIG. 1, the electronic device (not shown in FIG. 1 or 2) includes two antennas and the top cover 102 may include two recesses 137 defined within the interior surface of top 106 and configured to receive the two antennas. The recesses 137 may be defined so as to optimally orient the antennas of the electronic device for best transmission and/or reception. The recesses 137 defined within the top 106 of the top cover 102 may be configured so as to secure the antennas of the electronic device through a snap-fit process, an interference process or by any other means such as an adhesive, for example.

The outer enclosure may contain the electronic device with or without an electro-magnetic shield or Faraday cage. A Faraday cage or Faraday shield is an enclosure formed by conducting material or by a mesh of such material. Such an enclosure blocks out external static and non-static electric fields. Faraday cages are commonly used to protect electronic devices from electrostatic discharges that would otherwise harm the electronic components thereof. A Faraday cage for an electronic device should be configured with sufficiently thick conductive material and with holes that are sufficiently small to shield the electronic device that is to be protected from external electromagnetic radiation.

Figure 3:
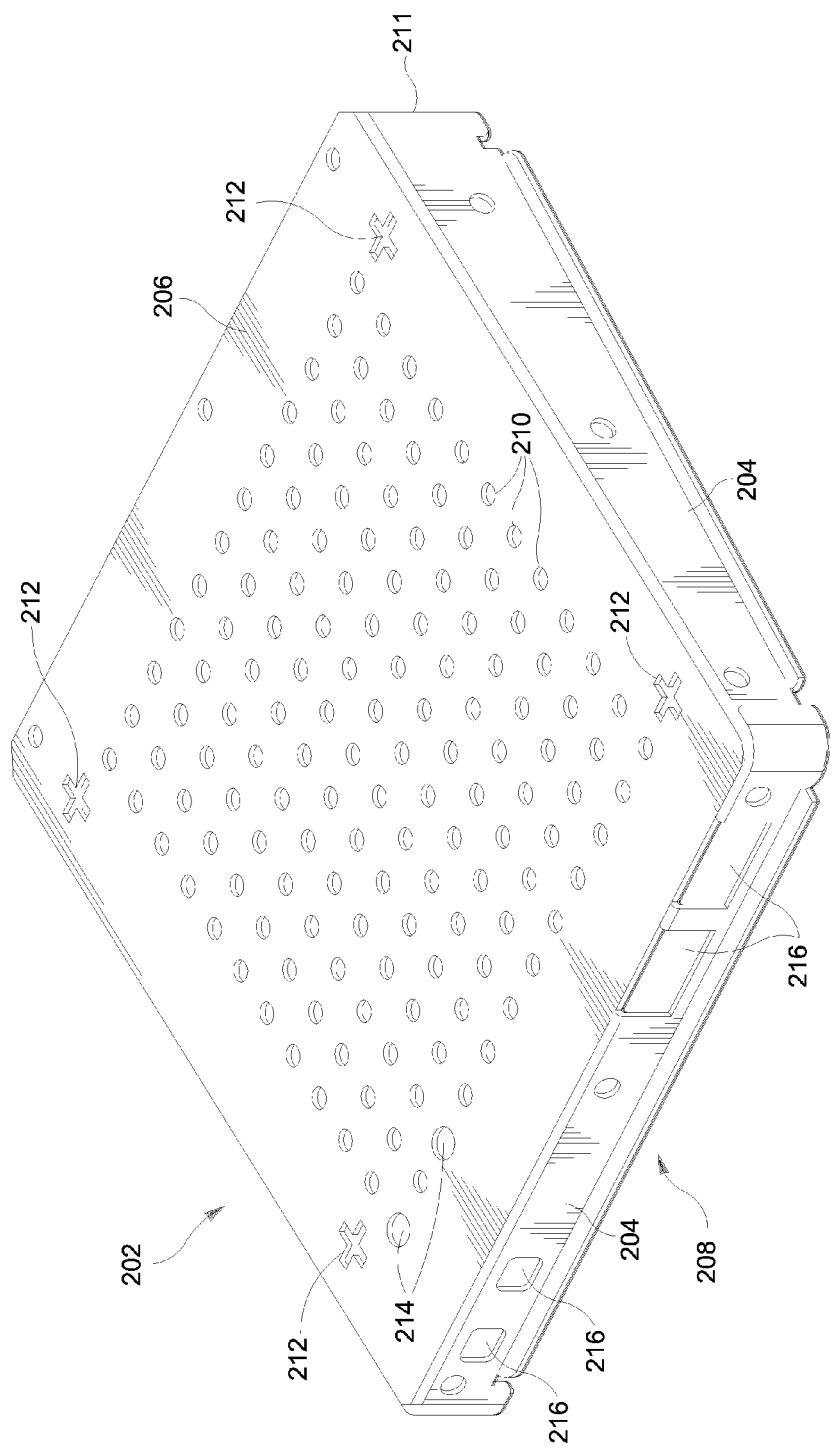
FIG. 3 shows one embodiment of an electro-magnetic shield configured for placement within an enclosure for an electronic device that includes one or more wireless antennas.

One embodiment of an electromagnetic shield or Faraday cage suitable for use in conjunction with the outer enclosure of FIGS. 1 and 2 is shown in FIG. 3. As shown therein, an electro-magnetic shield 202 configured for placement within an outer enclosure for an electronic device (such as shown in FIGS. 1 and 2) may include or be formed by a metallic cage, the metallic cage including sides 204, a bottom (removed in FIG. 3) and a top 206 that collectively define an enclosed volume that may be configured to contain an electronic device such as a PCB (and/or other discrete or integrated components) therein. As shown in FIG. 3, the front side 208 of the electro-magnetic shield 202 may be shorter than the opposing back side 211 thereof. These relative dimensions give the electro-magnetic shield 202 a wedge-like shape, in which the top 206 is slanted at a non-zero angle with respect to the bottom. The electro-magnetic shield 202 may also define a plurality of holes 210 in, for example, the top 206 and/or the bottom thereof. These holes 210 (preferably of smaller diameter than the wavelength of the electromagnetic radiation being shielded against) may be effective to decrease the weight of the electro-magnetic shield 202 and may enable efficient heat dissipation from the electronic components of the enclosed electronic device to the outside.

Figure 6:
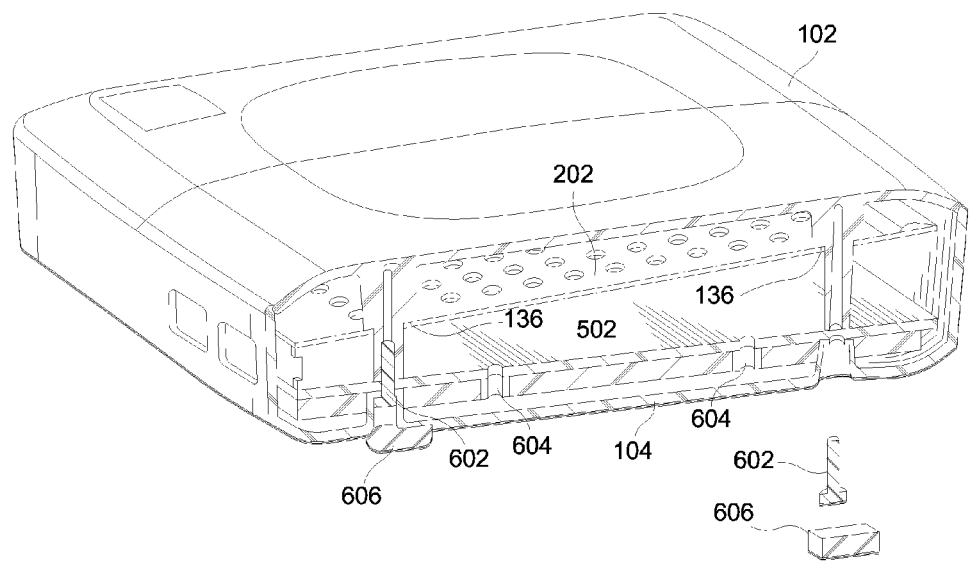
FIG. 6 is a cut-away view of one embodiment of an enclosure and an enclosed electromagnetic shield.
Figure 6:
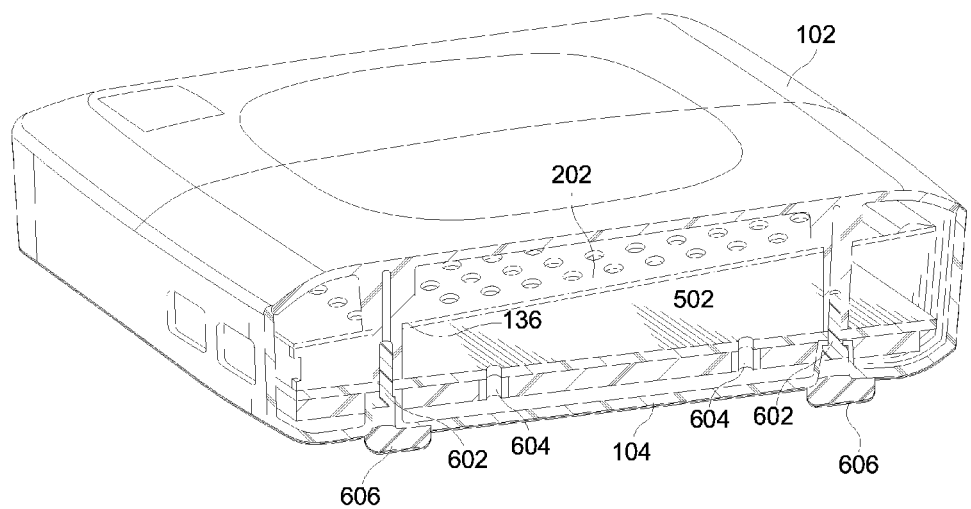

According to one embodiment, the electro-magnetic shield 202 may also, as shown in FIG. 3, include a set of (e.g., 4) beveled through-holes 212 defined in the top 206 of the metallic cage, near or at the corners thereof. The set of beveled through-holes 212 may be aligned with respective structural posts 120 of the outer enclosure, when the electro-magnetic shield 202 is enclosed by the outer enclosure. The beveled through-holes 212 may be configured to enable assembly of the outer enclosure by enabling the integral posts 120 of the top cover 102 to be inserted at least partially therethrough, so that the free ends thereof may face (and/or contact) the corresponding free ends of the projections 134 of the bottom cover 104, and so that the top and bottom cover 102, 104 (and now enclosed electro-magnetic shield 202) may be secured to one another by f, for example, the screws 602 shown in FIG. 6. As also shown in FIG. 6, when the top and bottom covers 102, 104 are mated to one another with the electro-magnetic shield 202 therebetween, the ledges 136 come into contact with the top 206 of the electromagnetic shield 202, preventing further travel of the top cover 102 of the outer enclosure. The beveled through holes 212, therefore, may be shaped (in a cross-like shape, for example as shown in FIG. 3) so as to conform to the shape or footprint of the integral posts 120. As shown in FIG. 2, the electro-magnetic shield 202 may define one or more additional openings 214, each configured to enable passage one of the electronic device's wireless antennas (or conductors thereof) through the top 206 of metallic cage. Such additional openings 214 may be somewhat larger or differently-shaped than the openings 210. To prevent fraying of the antennas or conductors thereof, the additional openings 214 may be fitted with soft (e.g., rubber) protective grommets.

As shown in FIG. 3, the front side 208 of the electromagnetic shield 202 (and/or the back side thereof) may include one or more cutouts 216 that may be aligned (when the electro-magnetic shield 202 is contained within the outer enclosure) with corresponding cutouts 112, 114, 126 defined within the outer enclosure and may be configured to accommodate an electrical connector or other structure.

Each of the through-holes 212 defined at or near the corners of the electro-magnetic shield 202 may be beveled to accommodate passage therethrough of a respective one of the structural posts 120 of the outer enclosure. The bevel in the through-holes 212 accounts for the non-zero slant of the top 206. Indeed, when the top and bottom covers 102, 104 are mated together with the electro-magnetic shield 202 disposed therebetween, the integral structural posts 120 form an angle that deviates from 90 degrees with the slanted top 206 of the electro-magnetic shield 202. The bevel in the surface that defines the through-holes 212 enables the integral structural posts 120 to be freely inserted therein, despite the angle of the slanted top 206 relative to the longitudinal axis of the structural posts 120. That is, the through-holes 212 may be beveled such that when the top and bottom covers 102, 104 of the outer enclosure and the metallic cage of the electro-magnetic shield 202 are mated together, the longitudinal axis of each of the respective structural posts 120 is not perpendicular with a plane defined by the top 206 of the metallic cage.

Figure 4:
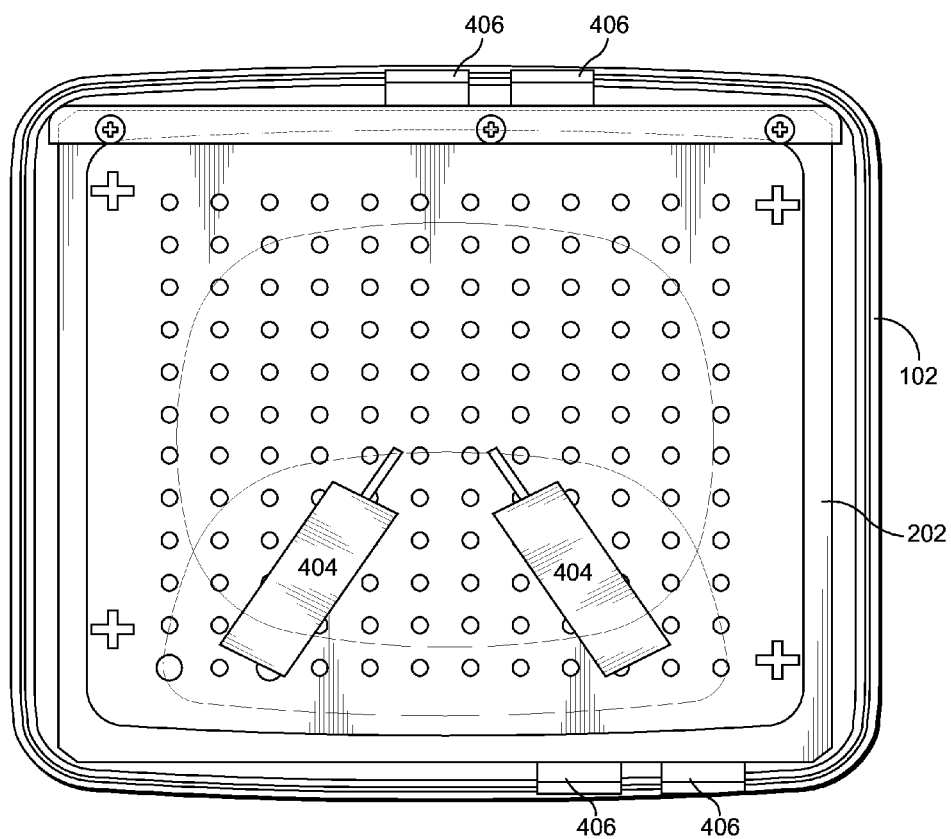
FIG. 4 is a top view of one embodiment of an enclosure and an enclosed electro-magnetic shield.
Figure 5:
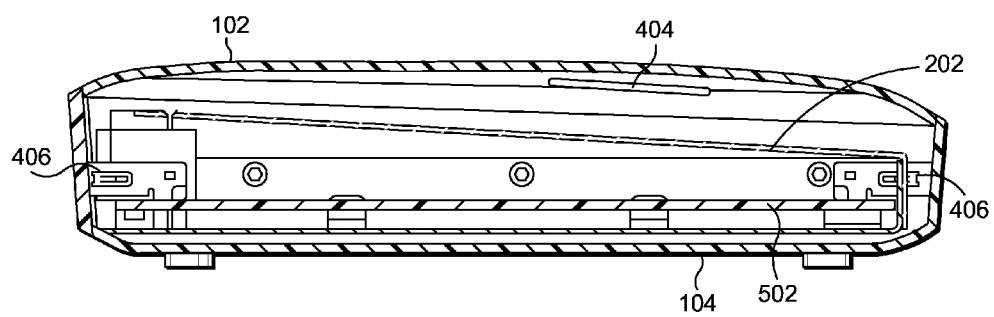
FIG. 5 is a side view of one embodiment of an enclosure and an enclosed electro-magnetic shield.

FIG. 4 shows a top view of one embodiment of an enclosure and an enclosed electro-magnetic shield, and FIG. 5 is a side view of one embodiment of an enclosure and an enclosed electro-magnetic shield. In these views, the outer enclosure is rendered translucent, to enable the contained structures (including the electro-magnetic shield 202) to be visible therethrough. As shown, antennas 404 may be mounted to the interior face of the top 106 of the top cover 102, within the recesses 137 shown in FIG. 1. A plurality of electrical connectors or knobs, displays or indicators may be fitted to or configured to face corresponding openings 112, 114, 126, 216 defined in the top and bottom covers 102, 104 and in the electro-magnetic shield 202. FIG. 5 also shows a PCB 502 secured within the electro-magnetic shield 202, protecting the PCB 502 against electro-magnetic discharges. FIG. 5 also shows that the antennas 404, mounted within the recesses 137 of the top cover 102, may be spaced apart from the electromagnetic shield 202 by a distance that sufficient such that the antennas performance is not unacceptably degraded by the nearby shield 202. This distance between the shield 202 and the antennas 404 is configured, at least in part, by the non-zero slant of the top 206 of the metallic cage with respect to the bottom thereof. The aforementioned slant also allows the outer enclosure to present a slim profile, while providing the antennas 404 of the electronic device disposed within the enclosed volume of the electro-magnetic shield with sufficient clearance so that the nearby electro-magnetic shield 202 does not unacceptably degrade the performance of the antennas 404.

The cut-away views of FIG. 6 show the PCB 502 supported within the electro-magnetic shield 202 by a plurality of posts 604 according to one embodiment. The PCB 502 may also define holes that are aligned with the structural posts 120 of the top cover 102 and the projections 134 of the bottom cover 104 of the outer enclosure, so as to secure the PCB within the electro-magnetic shield 202 and the outer enclosure. As also shown in FIG. 6, soft, rubberized feet 606 may be provided and fitted to the openings in the bottom cover 104, obscuring the screws 602 and providing the assembly with additional grip on smooth surfaces.

Figure 7:
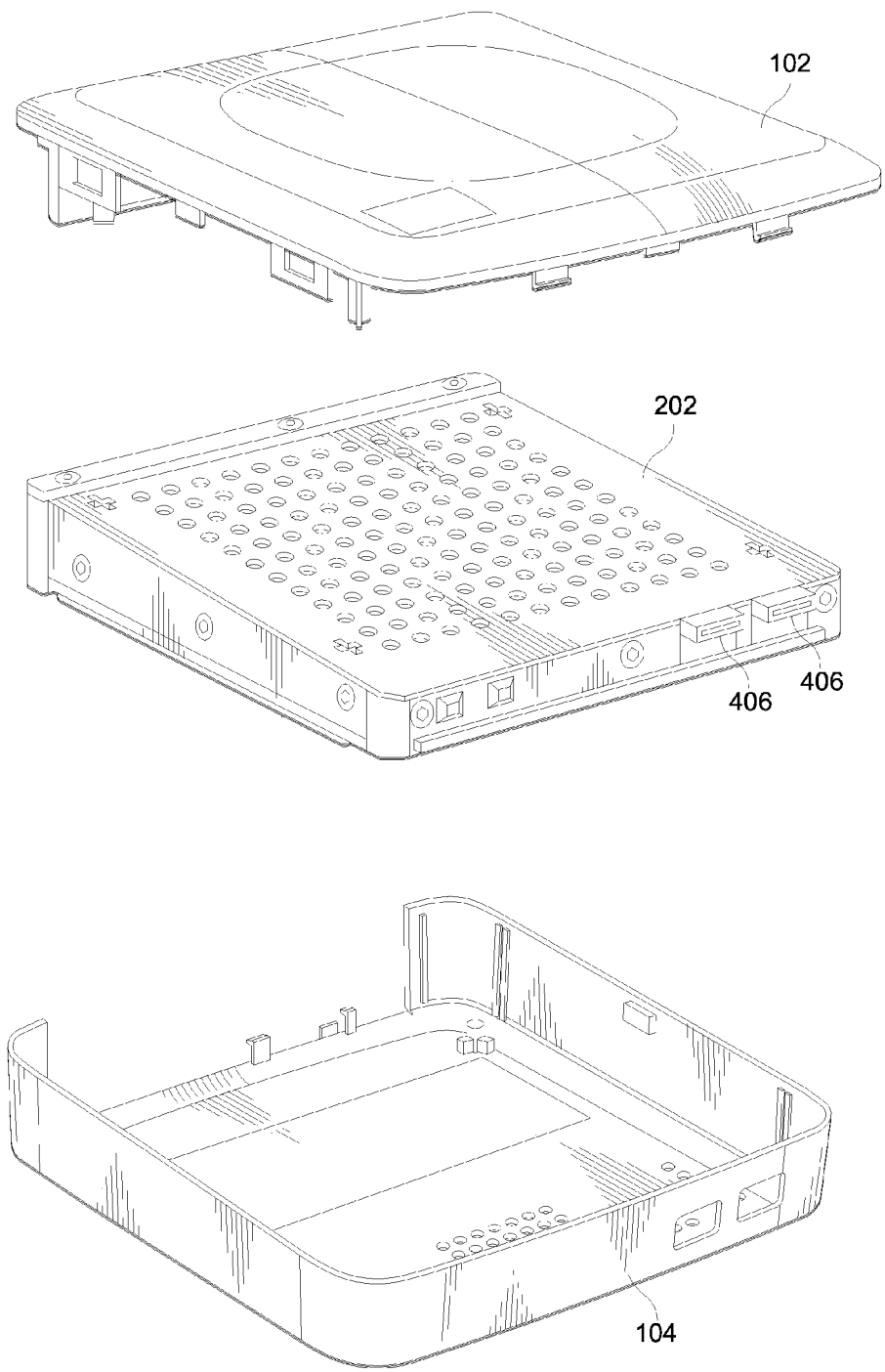
FIG. 7 is an exploded view of one embodiment of an enclosure and an enclosed electro-magnetic shield.

FIG. 7 is an exploded view of an enclosure and an enclosed electro-magnetic shield. To assemble an electronic device within the electro-magnetic shield 202 and outer enclosure, a PCB 502 (best shown in FIGS. 5 and 6) may be inserted within the electro-magnetic shield 202, with the bottom of the shield 202 removed, as shown in FIG. 2. The antennas 404 (or leads thereto) of the electronic device may be passed through the openings 214 of the electro-magnetic shield 202. The bottom of the electro-magnetic shield 202 may then be secured to the remaining structures thereof, so as to support the PCB 502 on the posts 604 in such a manner that the connectors 406 thereof are inserted within or at least face the openings 216 defined within the sides of the shield 202, as shown in FIG. 7. The electro-magnetic shield 202 and contained PCB 502 may then be mated with the bottom cover 104, such that holes (not shown) defined within the bottom (not shown) of the electro-magnetic shield 202 are aligned with the openings and projections 134 defined in the bottom cover 104 of the outer enclosure. The antennas 404 may then be secured within the recesses provided within the underside of the top cover 102. The top cover 102 may then be mated to the resulting assembly, with the structural posts 120 being inserted at least as far as the ledges 136 thereof onto and into the electro-magnetic shield 202, through the beveled openings 212 formed therein. Screws 602 may then be inserted and screwed tight through the openings and projections 134 in the bottom cover 104, and through the projections threaded cylinders 120 of the structural posts 120 of the top cover 102. The rubberized feet 606, if used, may then be fitted to the openings of the bottom cover 102, as shown in FIG. 6.

The embodiments shown and described herein allow for flexible use of a dual-configuration enclosure (i.e., with or without an internal Faraday cage), thus resulting in significant cost savings and enabling high volume manufacturing. The embodiments may also improve the ease with which the electronic device (such as a router, wireless Network Attached Storage (NAS) node or other wireless device) may be assembled within its outer enclosure and optional electromagnetic shield 202. The bevels in the openings 212 defined in the electro-magnetic shield 202 may facilitate the optional inclusion of the electromagnetic shield 202 within the outer enclosure at will, without the need to further modify the overall enclosure. The recesses (slots or grooves or like structure) 136, may be configured for ready placement of wireless antennas 404 to enable wireless functionality of the electronic device. The angle and placement of the antennas 404 (on the top cover 102 of the enclosure, for example) may be selected and optimized for transmit and receive signal strength.

While certain embodiments have been described, these embodiments have been presented by way of example only, and are not intended to limit the scope of the inventions. Indeed, the novel devices and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, those skilled in the art will appreciate that in some embodiments, the actual structures (such as, for example, the shape of the outer enclosure or that of the electro-magnetic shield 202 or the method of attaching one to the other) may differ from those described herein and shown in the figures. Depending on the embodiment, certain of the structures and/or assembly procedures described in the examples above may be removed, while others may be added. Also, the features and attributes of the specific embodiments disclosed above may be combined in different ways to form additional embodiments, all of which fall within the scope of the present disclosure. Although the present disclosure provides certain embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The invention claimed is:

1. An electro-magnetic shield configured for placement within an enclosure for an electronic device that includes at least one wireless antenna, the shield comprising:
   a metallic cage, the metallic cage including sides, a bottom and a top that collectively define an enclosed volume, the top being slanted at a non-zero angle with respect to the bottom;
   a set of beveled through-holes defined in the top of the metallic cage, the set of beveled through-holes being aligned with respective structural posts of the enclosure, wherein the beveled through-holes are configured to enable assembly of the enclosure, and
   at least one opening defined in the top of the metallic cage for passage of the at least one wireless antenna through the top of metallic cage.

2. The electro-magnetic shield of claim 1, further comprising a front side and a rear side, at least one of the front and rear sides defining a cutout that is configured to accommodate an electrical connector.

3. The electro-magnetic shield of claim 1, wherein the shield is further configured to receive at least a printed circuit board of the electronic device within the volume.

4. The electro-magnetic shield of claim 1, further including a plurality of openings defined in the metallic cage, at least one of the openings being sized to enable the at least one wireless antenna or a conductor thereof to be inserted therethrough.

5. The electro-magnetic shield of claim 1, wherein the set of beveled through holes are configured to conform to a shape of the respective structural posts of the enclosure.

6. The electro-magnetic shield of claim 5, wherein each of the beveled through-holes of the set of beveled through-holes has a generally cross-shape.

7. The electro-magnetic shield of claim 1, wherein each of the through-holes of the set of beveled through-holes is beveled to accommodate passage therethrough of a respective one of the structural posts of the enclosure, such that when the enclosure and the metallic cage are mated together, a longitudinal axis of each of the respective structural posts is not perpendicular with a plane defined by the top of the metallic cage.

8. An enclosure for an electronic device that includes a plurality of wireless antennas, the enclosure comprising:
   a metallic cage, the metallic cage including sides, a bottom and a top that collectively define an enclosed volume, the top being slanted at a non-zero angle with respect to the bottom;
   an outer enclosure at least partially enclosing the metallic cage, the enclosure defining a plurality of structural posts and a top surface that faces the top of the metallic cage, the top surface defining a plurality of recesses, each of the plurality of recesses being configured to receive a corresponding one of the plurality of wireless antennas of the electronic device, wherein the plurality of recesses are oriented to provide a predetermined angular displacement between the plurality of antennas;
   a set of beveled through-holes defined in the top of the metallic cage, the set of beveled through-holes being aligned with respective ones of the structural posts.

9. The enclosure of claim 8, wherein a plurality of openings are defined in the top of the metallic cage, each of the plurality of openings being configured for passage of one of the plurality of wireless antennas therethrough.

10. The enclosure of claim 8, wherein the outer enclosure includes a top portion and a bottom portion and wherein each of the structural posts is configured to receive a screw to secure the top and bottom portions together.

11. The enclosure of claim 8, wherein the outer enclosure includes a top portion and a bottom portion and wherein each of the structural posts is configured to snap-fit to secure the top and bottom portions together.

12. The enclosure of claim 8, further comprising a front side and a rear side, at least one of the front and rear sides defining a cutout that is configured to accommodate an electrical connector.

13. The enclosure of claim 8, wherein the shield is further configured to receive at least a printed circuit board of the electronic device within the enclosed volume.

14. The enclosure of claim 8, further including a plurality of openings defined in the metallic cage, at least some of the openings being sized to accommodate one of the plurality of antennas therethrough.

15. The enclosure of claim 8, wherein the set of beveled through holes are configured to conform to a shape of the respective structural posts of the enclosure.

16. The enclosure of claim 15, wherein each of the beveled through-holes of the set of beveled through-holes has a generally cross-shape.

17. The enclosure of claim 8, wherein each of the through-holes of the set of beveled through-holes is beveled to accommodate passage therethrough of a respective one of the structural posts of the enclosure, such that when the enclosure and the metallic cage are mated together, a longitudinal axis of each of the respective structural posts is not perpendicular with a plane defined by the top of the metallic cage.

18. The enclosure of claim 8, wherein the outer enclosure and the plurality of recesses defined therein are configured to define a spacing between the antennas received in the recesses and the metallic cage that is sufficient so as to not substantially degrade a performance of the plurality of antennas.

* * * * *